United States Patent
Jiang et al.

(10) Patent No.: US 9,596,110 B2
(45) Date of Patent: Mar. 14, 2017

(54) OPEN LOOP DIGITAL PWM ENVELOPE TRACKING SYSTEM WITH DYNAMIC BOOSTING

(71) Applicant: Futurewei Technologies, Inc., Plano, TX (US)

(72) Inventors: Hong Jiang, Kernersville, NC (US); Wael Al-Qaq, Oak Ridge, NC (US); Robert Grant Irvine, Greensboro, NC (US); Matthew M. Kostelnik, Louisville, CO (US); Zhihang Zhang, Cary, NC (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 14/677,288

(22) Filed: Apr. 2, 2015

(65) Prior Publication Data

US 2016/0294587 A1 Oct. 6, 2016

(51) Int. Cl.
*H03K 7/08* (2006.01)
*H04L 25/49* (2006.01)
(Continued)

(52) U.S. Cl.
CPC ......... *H04L 25/4902* (2013.01); *H03F 3/193* (2013.01); *H03F 3/21* (2013.01); *H03F 3/217* (2013.01); *H04B 1/04* (2013.01); *H03F 1/0222* (2013.01); *H03F 1/0227* (2013.01); *H03F 1/0266* (2013.01); *H03F 2200/102* (2013.01);
(Continued)

(58) Field of Classification Search
CPC .... H03F 1/0222; H03F 1/0227; H03F 1/0266; H03F 2200/504; H03F 3/193; H03F 3/21; H03F 3/217; H03F 2200/102; H03F 2200/351; H03F 2200/451; H04L 25/4902;
(Continued)

(56) References Cited

U.S. PATENT DOCUMENTS

| | | |
|---|---|---|
| 2012/0214431 A1 | 8/2012 | Kanno et al. |
| 2013/0107769 A1 | 5/2013 | Khlat et al. |
| 2014/0285261 A1* | 9/2014 | Dakshinamurthy .... H03F 1/025 330/127 |

FOREIGN PATENT DOCUMENTS

| WO | WO-2012/178138 A1 | 12/2012 |
|---|---|---|
| WO | WO-2014/197399 A1 | 12/2014 |

OTHER PUBLICATIONS

"International Application Serial No. PCT/CN2015/096177, International Search Report Mar. 1, 2016", 6 pgs.
"International Application Serial No. PCT/CN2015/096177, Written Opinion mailed Mar. 1, 2016", 4 pgs.

(Continued)

*Primary Examiner* — Janice Tieu
(74) *Attorney, Agent, or Firm* — Schwegman Lundberg & Woessner, P.A.

(57) ABSTRACT

A system, apparatus and method is described for dynamically boosting (increasing) the power supply voltage to an envelope tracking (ET) modulator within a transmitter system when the target/desired power amplifier voltage supply is above a predetermined threshold (e.g., equal to the available power supply of the system, such as a battery). By boosting the power input supply to the ET modulator, the modulated power supply provided to the power amplifier (PA) is also increased. This reduces or eliminates clipping that normally occurs when the target/desired PA supply voltage is greater than the available power supply voltage and reduces distortion in the transmitted signal.

18 Claims, 10 Drawing Sheets

(51) Int. Cl.
    *H03F 3/193*      (2006.01)
    *H03F 3/21*      (2006.01)
    *H03F 3/217*      (2006.01)
    *H04B 1/04*      (2006.01)
    *H03F 1/02*      (2006.01)

(52) U.S. Cl.
    CPC .. *H03F 2200/351* (2013.01); *H03F 2200/451* (2013.01); *H03F 2200/504* (2013.01); *H04B 2001/045* (2013.01); *H04B 2215/063* (2013.01)

(58) Field of Classification Search
    CPC ................ H04B 1/04; H04B 2001/045; H04B 2215/063
    See application file for complete search history.

(56) References Cited

OTHER PUBLICATIONS

Hassan, Muhammad, et al., "High Efficiency Envelope Tracking Power Amplifier with Very Low Quiescent Power for 20 MHz LTE", *2011 IEEE Radio Frequency Integrated Circuits Symposium*, (2011), 1-4.

* cited by examiner

US 9,596,110 B2

OPEN LOOP DIGITAL PWM ENVELOPE TRACKING SYSTEM WITH DYNAMIC BOOSTING

TECHNICAL FIELD

The present invention relates to wireless communications and, in particular, to a wireless transmitter having a power amplifier with an envelope tracking modulator.

BACKGROUND

In wireless communication terminals, such as mobile phones, modulating the supply voltage of the power amplifier (PA) in such a way as to follow the envelope of the transmitted signal allows the PA to be operated at a higher efficiency—reducing power consumption. This technique is known as envelope tracking (ET). The circuitry/component that modulates the supply voltage input to the PA in this type of system is called an ET modulator.

In most mobile applications (e.g., mobile phones), the operating supply voltage is provided by a battery which is, in turn, input to the ET modulator for modulation, with the modulated supply voltage input to the PA. In some applications, the desired PA supply voltage may be higher than the available battery voltage. Usually when this happens, the transmitter is operating at maximum output power. During this time, the ET modulator can only output a modulated supply voltage that is equal to (or less than) the battery voltage—resulting in the PA supply voltage being clipped. This clipping behavior creates a significant amount of distortion that degrades the transmitted signal—showing up as adjacent channel power rejection (ACPR) degradation and error vector magnitude EVM) degradation.

Accordingly, there are needed circuits, systems and methods to reduce clipping of the supply voltage output from the ET modulator and input to the PA, thereby improving performance of the transmitter.

SUMMARY

According to the present disclosure, there is provided a transmitter having an envelope generator configured to receive a data signal to be transmitted and generate an envelope signal based on the received data signal. A pulse width modulation (PWM) generator is coupled to the envelope generator and configured to output a PWM signal to an envelope tracking (ET) modulator coupled to the PWM generator. The ET modulator is configured to receive the PWM signal and output a power amplifier (PA) switching supply source and configured to receive a first supply voltage or a second supply voltage in response to an ET modulator boost enable signal, wherein the second supply voltage is greater than the first supply voltage.

In another embodiment, there is provided a method of dynamically boosting a supply input voltage to a power amplifier (PA) in a transmitter that includes an envelope signal generator and an envelope tracking (ET) modulator. The method includes receiving a first signal indicative of a voltage level of an available supply voltage for the transmitter, receiving an envelope signal output from the envelope signal generator, the envelope signal generated in response to a data signal to be transmitted, comparing the envelope signal to the first signal, and (1) when the envelope signal is less than a predetermined threshold based upon the first signal, inputting the available supply voltage to the ET modulator, and (2) when the envelope signal is greater than the predetermined threshold based upon the first signal, inputting a boosted supply voltage to the ET modulator.

In yet another embodiment, there is provided a transmitter including a power terminal configured to deliver an available supply voltage from an available power source for use by the transmitter. A boost circuit is coupled to the power terminal and configured to generate a boosted supply voltage greater than the available supply voltage. An envelope generator is configured to receive a data signal to be transmitted by the transmitter and generate an envelope signal for input to a pulse width modulation (PWM) generator configured to output a PWM signal. The transmitter further includes an envelope tracking (ET) modulator coupled to the PWM generator and configured to modulate an ET modulator input supply voltage. A controller is configured to receive the envelope signal and a signal indicative of the available power supply voltage and generate a dynamic boost enable/disable signal in response thereto. A switching circuit is coupled to the available supply voltage and the boosted supply voltage and configured to select and input either the available supply voltage or the boosted supply voltage as the ET modulator input supply voltage.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION

The present disclosure describes an envelope tracking power amplifier and compensation system for use in a transmitter within a wireless communication device/terminal in a communications system. Such wireless communications systems may operate in accordance with any protocol, standard or specification, including for example, those such as Global System for Mobile (GSM), Code Division Multiple Access (CDMA), Universal Mobile Telecommunication System (UMTS), Worldwide Interoperability for Microwave Access (WiMAX), WiFi, and the like, as well as others known to those skilled in the art.

Numerous portions or aspects of the communications device/terminal and its transmitter system are omitted for brevity, and only those elements or devices necessary or relevant to an understanding of the present disclosure are described or shown herein.

The present disclosure describes and discloses various embodiments of a system, apparatus and method for dynamically boosting (increasing) the power supply voltage to an ET modulator within a transmitter system when the target/desired power amplifier voltage supply is above a predetermined threshold (e.g., equal to the available power supply of the system, such as a battery). By boosting the power input supply to the ET modulator, the power supply provided to the power amplifier (PA) is also increased. This reduces or eliminates clipping that normally occurs when the target/desired PA supply voltage is greater than the available power supply voltage and reduces distortion in the transmitted signal.

In general terms, the present disclosure describes various circuitry and methods that sense/measure/determine the both the available power supply voltage that supplies power to the ET modulator and the target/desired PA power supply voltage. When the target/desired PA power supply voltage exceeds a predetermined threshold which is based on the available power supply voltage, a boosted supply voltage is input to the ET modulator. In other words, the magnitude of the supply voltage to the ET modulator is increased or boosted to a higher level. This is referred to as dynamic boosting. In one embodiment, this is accomplished by switching between the available voltage supply and a boosted voltage supply, where the boosted voltage supply is generated from the available voltage supply by a boost circuit.

A mode controller receives the two voltage values and determines whether the ET modulator should receive the available voltage supply as its input supply or a boosted voltage supply as the input supply. The ET modulator operates in one of two different modes: (1) normal operating mode in which the available voltage supply is input to the ET modulator, and (2) boost operating mode in which a boosted voltage supply is input to the ET modulator. As will be appreciated, the ET modulator (and its various embodiments) and related components described herein are part of a cellular terminal, device or base station.

Figure 1:
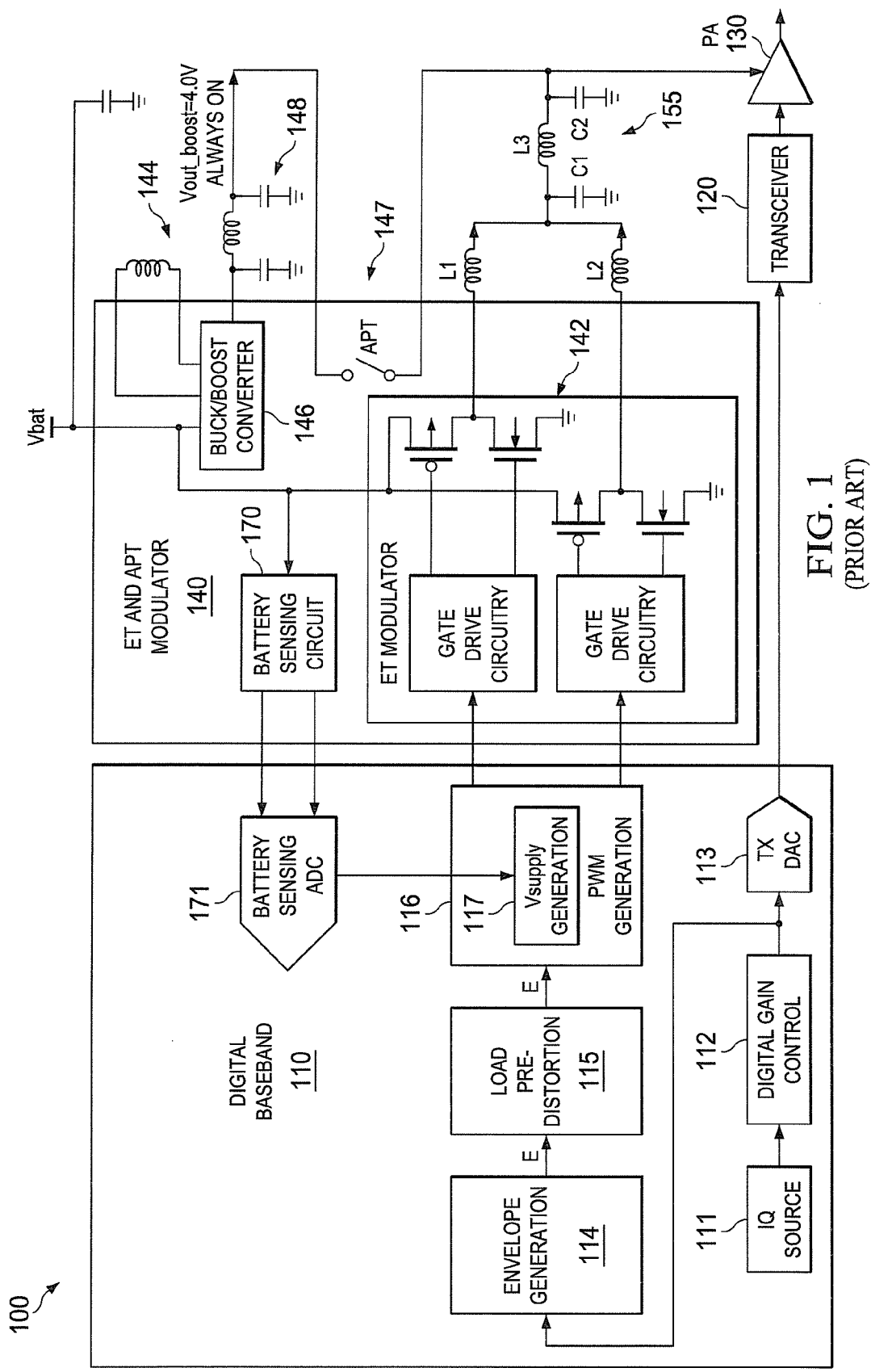
FIG. 1 is a diagram illustrating a portion of the circuit/components of a prior art transmitter system within a wireless communications terminal/device, including an envelope tracking (ET) modulator system.

Turning to FIG. 1, there is shown a block diagram of a portion of the circuit/components of a prior art transmitter system 100 within a wireless communications terminal/device. Although other circuitry/components may be included in the transmitter system 100, only those portions necessary and relevant for an understanding of the present disclosure are shown therein.

The main components shown include digital baseband circuitry 110, a transceiver 120, a power amplifier (PA) 130 and an envelope tracking (ET) and average power tracking (APT) modulator 140. The ET and APT modulator 140 includes an ET modulator 142 having a switching core for implementing the envelope tracking function and an APT modulator 144 having a buck/boost circuit providing a switching core for implementing the APT function.

Within the digital baseband circuitry 110, an IQ source 111 provides input signals (e.g., digital in-phase (ID) and quadrature (QD) components of a baseband signal—not separately shown in the FIGURES) to a digital gain control circuit 112 which, in turn, provides the signals to a digital-to-analog converter (DAC) 113. The DAC 113 converts the ID and QD components into analog versions I and Q for input to the transceiver 120.

The transceiver 120 (which may include a receiver) converts the analog I and Q signals to a radio-frequency (RF) signal "X". RF signal X is input to the power amplifier (PA) 130 for amplification to generate an RF signal Y at a power level required for transmission from an antenna (not shown) of the transmitter system 100.

Signals ID and QD (after gain control) are also input to an envelope generator 114 that generates an envelope waveform "E" of the transmitted signal. The E signal is processed by a predistortion circuitry 115 to apply predistortion. For a non-ideal ET modulator, the waveform E can be adjusted (predistorted) to compensate for frequency response and non-linearity of the ET modulator 142 so that $V_{CC}$ more closely corresponds to the waveform E. In other words, for a given power amplifier (PA) impedance characteristic, the impact on the frequency response and non-linearity of the ET modulator 142 can be compensated by adjusting (predistorting) the input waveform E. This is known in the art.

The waveform E is input to a pulse width modulation (PWM) generator 116 that drives switching circuitry of the ET modulator 142 (within the ET and APT modulator 140) with non-overlapping (break-before-make) high-side and low-side waveforms PWMH and PWML, whose pulse width as a function of time corresponds to the envelope waveform E. Thus, the PWM generator 116 receives the waveform E and generates suitable switching signals to the ET modulator 142 which generates the PA supply voltage $V_{CC}$ (from the primary supply $V_{bat}$ of the device).

The PWM generator 116 also includes a $V_{supply}$ generation circuit 117 that receives a signal representative of the primary supply voltage $V_{bat}$ (i.e., the ET modulator supply voltage). The $V_{supply}$ generation circuit 117 functions to scale the PWM signal duty ratio accordingly.

At the output of the switching stage of the ET modulator 142, a low-pass inductor-capacitor (LC) filter circuit 155 formed by of $L_1$, $L_2$, $C_1$, $L_3$ and $C_2$ removes the high-frequency components of the output voltage in order to generate the required PA supply voltage waveform $V_{CC}$. As will be appreciated, different configurations of the filter circuit 155 may be utilized as desired.

The APT modulator 144 includes a buck/boost converter circuit 146, an APT switch 147, and a second LC circuit 148. The APT (average power tracking) modulator 144 may be utilized in different operating scenarios in which average power tracking is desired. As will be appreciated, the available supply voltage may be any voltage/power source, and in the embodiments described herein is provided by a battery, which may also be rechargeable.

In one embodiment, the system 100 includes components enabling the system to adapt to a battery having different voltages. A slow Vbat sensing circuit 170 measures or senses the primary supply voltage $V_{bat}$ (analog) and outputs an analog signal. The analog signal is converted into a digital signal using an analog-to-digital converter (ADC) 171 and input to the $V_{supply}$ generation circuit 117 of the PWM generator 116 to scale the PWM output signal(s) duty ratio.

In the transmitter system 100 shown in FIG. 1, the PA input peak signal (the peaks of the digitally modulated signal) may be sufficiently high such that the desired PA input supply voltage $V_{CC}$ (to maintain acceptable ACPR performance) is higher than the available battery voltage supply (Vbat). This scenario is illustrated in FIG. 2.

Figure 2:
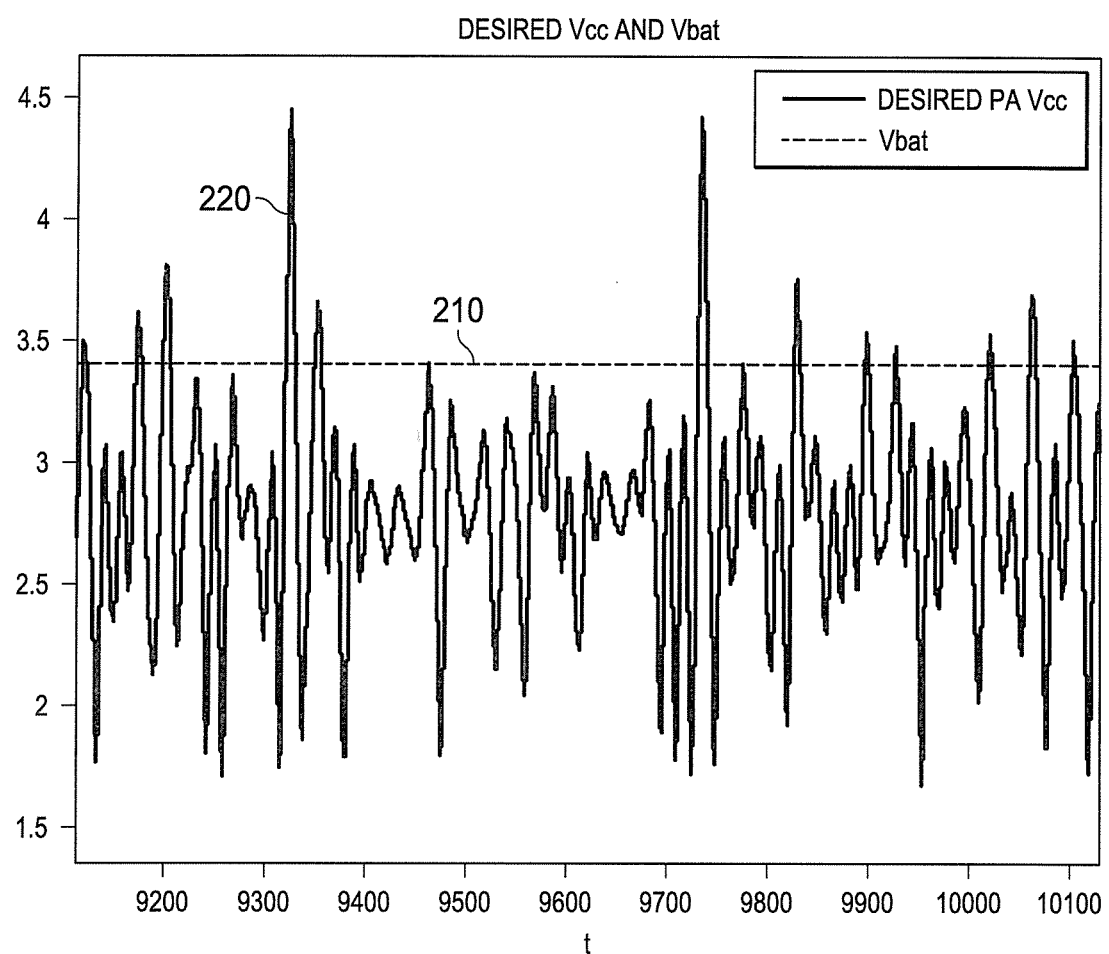
FIG. 2 is a signal waveform illustrating a static primary voltage supply to the ET modulator and an example desired power amplifier supply voltage over time.

FIG. 2 is a graph showing both the relatively static primary voltage supply $V_{bat}$ (shown being equal to approximately 3.4 volts) 210 and an example desired PA supply voltage $V_{CC}$ 220 over time. Because the primary voltage supply $V_{bat}$ input to the ET modulator 142 is constrained, the maximum PA supply voltage $V_{CC}$ output from the ET modulator 142 is similarly constrained. Because of this, when the desired PA supply voltage 220 is greater than the voltage supply $V_{bat}$ 210, it is limited, and the PA 130 only receives a supply voltage equal (approximately) to the voltage supply $V_{bat}$. This would cause clipping resulting in ACPR and EVM degradation.

Table 1 below shows the simulated power amplifier output spectrum and ACPR performance under the following condition where the Signal Type: LTE, BW=20 MHz full RB signal, Pout=26.5 dBm, and Battery voltage=3.4 volts.

TABLE 1

|  | 'EUTRA' | 'UTRA1' | 'UTRA2' |
| --- | --- | --- | --- |
| Left | 33.8016 | 39.6309 | 39.4673 |
| Right | 34.1496 | 38.468 | 40.3632 |

These simulated results show the ACPR performance of the system 100 illustrated in FIG. 1, without the teachings of this present disclosure.

Figure 3:
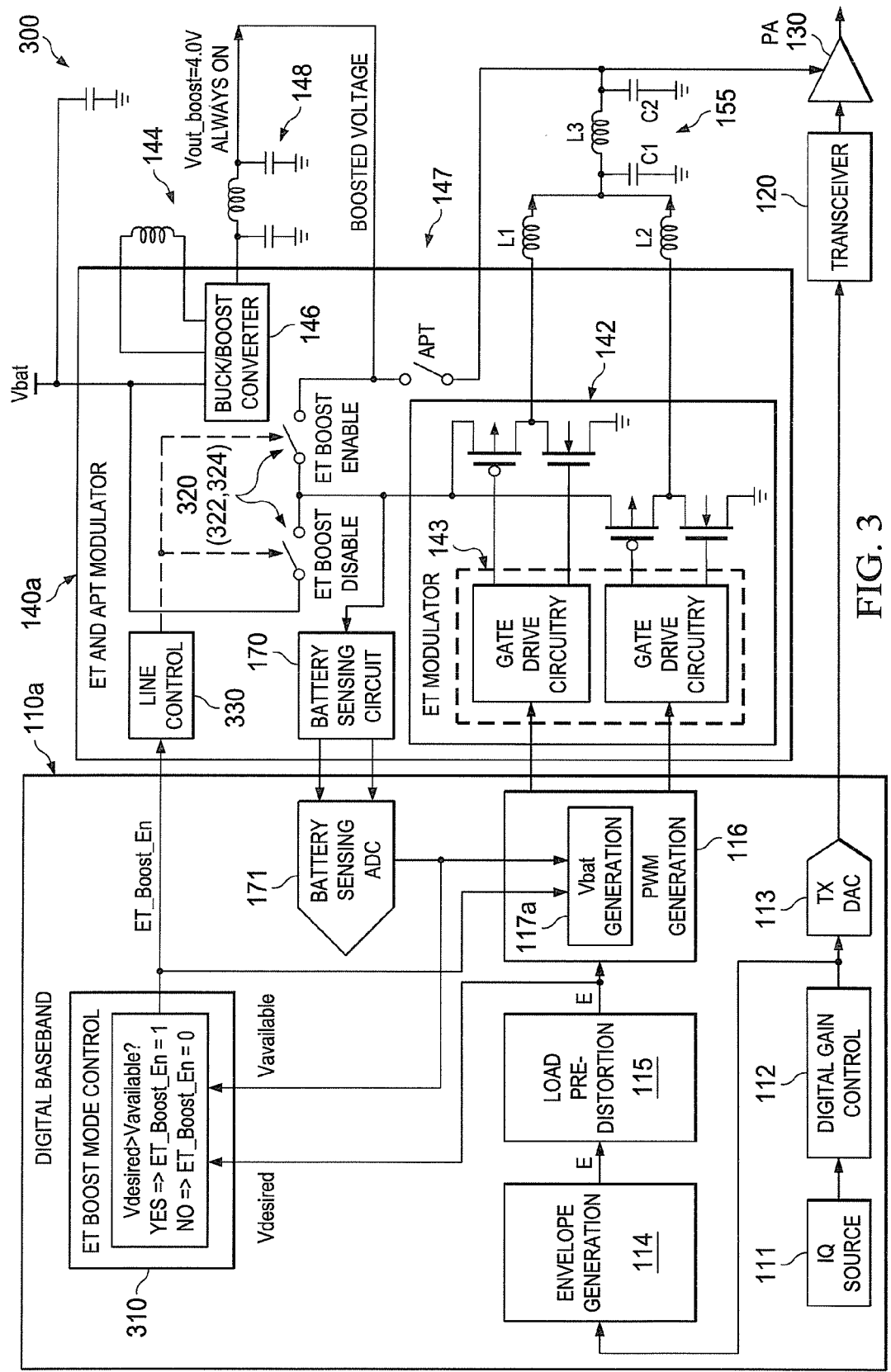
FIG. 3 is a diagram of illustrating relevant portions of a transmitter system in accordance with the present disclosure.

Now turning to FIG. 3, there is shown a block diagram of a portion of the circuit/components of a transmitter system 300 in accordance with the present disclosure and teachings. The system 300 is includes a number of components that are the same or similar to components in the transmitter system 100 shown in FIG. 1. For brevity and ease of reference, those same/similar components have the same reference numbers as used in FIG. 1 and perform the same/similar function(s) as those described with respect to FIG. 1.

The transmitter system 300 further includes a system/circuitry/method for dynamically boosting the supply voltage supplied to the ET modulator 142 to a level greater than the primary device supply voltage (e.g., $V_{bat}$). ET modulator supply voltage boosting is implemented when the desired PA supply voltage $V_{cc}$ (based on the envelope of the transmitted signal) equals or exceeds a predetermined voltage level threshold. This threshold is usually set at or near the voltage level of the primary supply voltage (e.g., $V_{bat}$).

As illustrated, the system 300 includes digital baseband circuitry 110a having an ET boost mode controller or control circuitry 310, and further includes ET and APT modulator 140a having an ET boost selection circuit 320 and, optionally, a line control circuit 330. In general terms, the ET boost mode controller 310 receives signals representative of the primary supply voltage (e.g., $V_{bat}$) and the desired PA supply voltage $V_{cc}$ (e.g., signal E, target voltage) and generates a boost enable/disable signal. For example, when the waveform E signal (input to the PWM generator 116) is equal to or greater than $V_{bat}$, the controller 310 asserts the ET boost enable/disable signal causing the selection circuit 320 to select and input a first voltage supply (e.g., the boosted voltage output from the buck/boost converter 146) as the voltage supply to the ET modulator 142. Similarly, when the waveform E signal (input to the PWM generator 116) is less than $V_{bat}$, the controller 310 disables the ET boost enable/disable signal and the selection circuit 320 selects a second voltage supply (e.g., $V_{bat}$) to provide the supply voltage to the ET modulator 142. By monitoring the desired PA supply voltage $V_{cc}$ (e.g., signal E) and the available primary supply voltage (e.g., $V_{bat}$), a decision can be made within the digital baseband circuit 110a whether boost is needed.

In one embodiment, the ET boost selection circuit 320 includes a first switch 322 and a second switch 324. As will be appreciated, various suitable circuits, structures or components may be utilized to provide the desired switching function as described herein. It is preferred to utilize fast switching between the two supply voltages and, therefore, switches with suitable fast turn on/off times should be utilized. For envelope tracking (ET) mode operation, the existing APT boost converter circuit can be re-used to generate the desired boosted ET modulator supply voltage (Vout_boost). The Vout_boost signal can be routed to the ET modulator 142 supply by properly configuring the switch positions of the switches 322, 324, 147. When the switch 322 is closed and the switches 324, 147 are open, normal ET modulator operation occurs with the battery supply voltage Vbat providing the supply operation. When the switch 324 is closed and the switches 322, 147 are open, boosted ET modulator operation occurs with the boosted supply Vout_boost providing the supply operation. When the switch 147 is closed and the switches 322, 324 are open, the normal APT mode is active. In one example, the magnitude of Vout_boost may be 4 volts while the magnitude of the supply voltage Vbat will generally be less than 4 volts.

In the transmitter system 300 shown in FIG. 3, the PA input peak signal (the peaks of the digitally modulated signal) may be sufficiently high such that the desired PA input supply voltage $V_{CC}$ (to maintain acceptable ACPR performance) is higher than the available battery voltage supply ($V_{bat}$). However, when this occurs, the ET boost mode controller 310 via the selection circuit 320 selects and inputs a voltage supply that is greater than $V_{bat}$. The resulting scenario is illustrated in FIG. 4.

Figure 4:
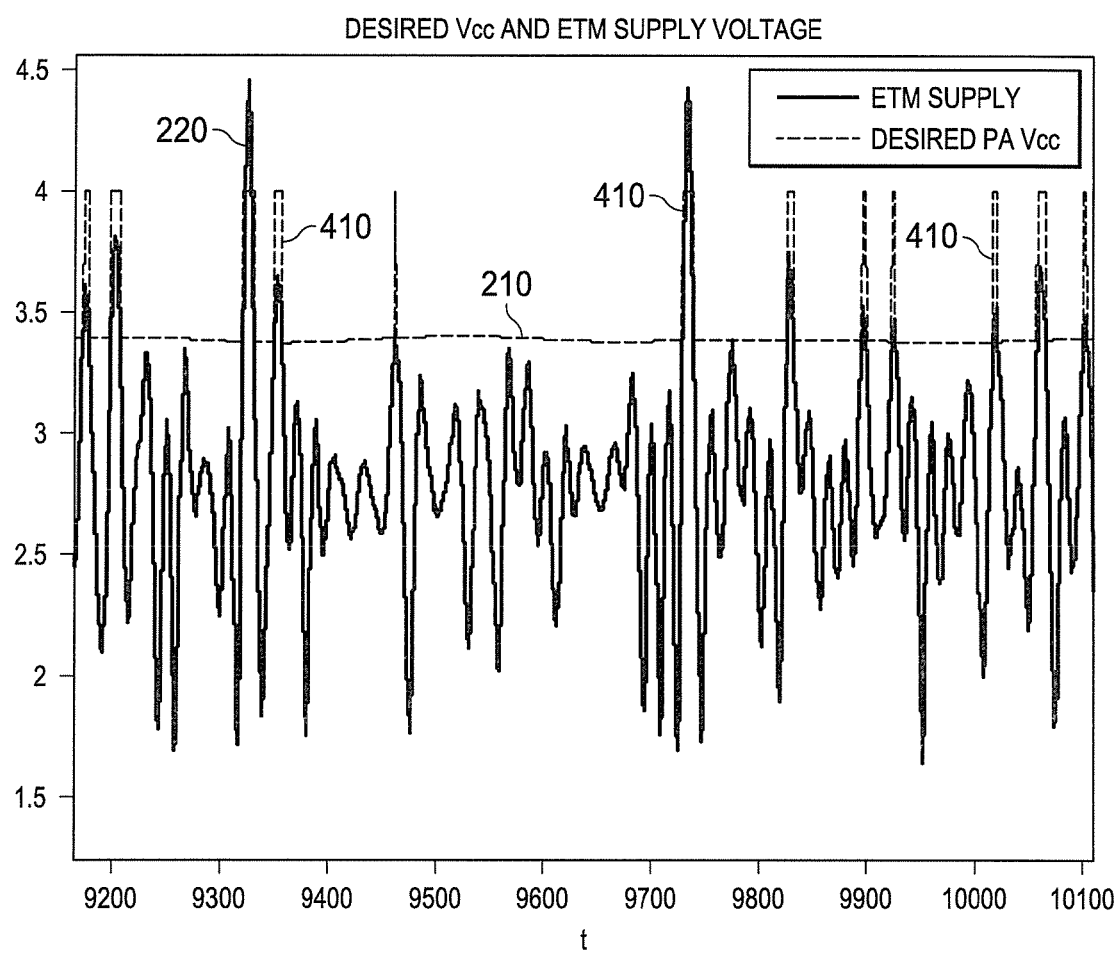
FIG. 4 is a signal waveform illustrating the voltage supply to the ET modulator with dynamic boosting and an example desired power amplifier supply voltage over time.

FIG. 4 is a graph showing both the relatively static primary voltage supply $V_{bat}$ (shown being equal to approximately 3.4 volts) 210 and the example desired PA supply voltage $V_{CC}$ 220 over time. During a time period when the desired PA supply voltage $V_{CC}$ 220 approximately equals (and is greater than) the primary voltage supply $V_{bat}$, the ET boost mode controller asserts the boost enable signal thereby providing the boosted voltage as the voltage supply to the ET modulator 142. Each of the reference numerals 410 illustrate the ET modulator supply voltage during one of these time periods (not all such time periods are labeled with reference numeral 410).

In the example in which the boost voltage output from the buck/boost converter 146 equals 4 volts, clipping will occur when the desired when the desired PA supply voltage 220 is greater than 4 volts. In the illustrated example, since most of the times the desired voltage is 4 volts or less, no clipping will occur. Thus, the present disclosure reduces the effect of clipping when the desired voltage is greater than the device's supply voltage (e.g., $V_{bat}$)—most of the PA supply peaks will not experience clipping.

It will be understood that the value of the boosted voltage may be different than 4 volts (and 4 volts is just an example). The amount of the boosted voltage will be a design choice depending on the desired specifications for the system 300 (e.g., circuit configuration, power specifications, etc.), but will be higher than the voltage of the available power supply.

The PA input signal peaks happen only rarely during a transmit burst, however, the linearity degradation is large because some of the peaks are significantly high and cause deep clipping. With this dynamic boosting architecture, only a small amount of amount of efficiency may be sacrificed (since the boosted supply is rarely used) while a large improvement in linearity (remove light clipping and reduce deep clipping) is gained.

Table 2 below illustrates this and shows the simulated power amplifier output spectrum and ACPR performance under the following condition where the Signal Type: LTE, BW=20 MHz full RB signal, Pout=26.5 dBm, and Battery voltage=3.4 volts.

TABLE 2

|  | 'EUTRA' | 'UTRA1' | 'UTRA2' |
| --- | --- | --- | --- |
| Left | 38.2796 | 44.5026 | 43.9509 |
| Right | 38.7142 | 44.1211 | 44.8159 |

A significant improvement of 4-5 dB in ACPR when dynamic ET booting is implemented.

As described, the output of the load pre-distortion circuit 115 (e.g., desired PA supply voltage $V_{cc}$) is compared to the measured available voltage (e.g., the battery voltage) continuously. If the desired voltage is higher than the measured battery voltage, clipping can be expected. To reduce the clipping, a boosted voltage supply is switched to power the ET modulator 142. A predetermined threshold level based on the available voltage supply may be utilized. In one embodiment, the threshold level could be equal to the value of the available voltage supply or another value that is greater (or less). In most applications, when the magnitude of the desired PA supply voltage $V_{cc}$) is above the measured available voltage (e.g., the battery voltage), the boost voltage supply should be utilized for input to the ET modulator.

For example, the threshold level set for initiating voltage supply boosting may be when the desired PA supply voltage Vcc>Vbat*A, where "A" is a coefficient that may be fixed or adjustable. To illustrate, assume that A is 1.05 and Vbat equals 3.4 volts. In this case, ET supply voltage boosting will be performed when the desired PA supply voltage supply Vcc equals about 3.57 volts (3.4×1.05). One reason(s) to use a threshold that is slight greater than the available supply voltage is to conserve power and use the boost voltage supply only when there is substantial clipping. In other words, slight clipping might be tolerated because it only causes slight distortion, while it is most desirable to reduce/prevent heavy/deep clipping events.

As will be appreciated, switching the voltage supply input to ET modulator 142 between the available voltage supply and the boosted supply voltage should be performed as fast as possible, so that the boosting operation can be activated for only a short period of time. To accomplish this, the boost circuit 146 may be continuously enabled (always on) and output the boosted voltage. Since the boost switch 324 will normally be open, current consumption in the boost idle state will be relatively low. In addition, the optional line control circuit 330 may be implemented. As compared to other control methods (e.g., MOPI control), line control applies the control signal directly to the target circuit without any decoding of the signal(s)—which results in faster reaction times.

The PWM generator 116 utilizes the ET modulator 142 voltage supply information to generate the PWM signal. The battery sensing and ADC circuits 170,171 are typically designed to operate at a slow speed (to save current and because the battery voltage usually only changes at a slow speed). In the dynamic ET voltage supply boosting technique described and taught herein, the ET voltage supply sensed by circuits 170,171 changes fast (and it is preferred to change as fast as possible). As a result, the ET modulator voltage supply information utilized by the PWM generator 116 should also adapt to the fast switching of supply voltages.

Figure 5:
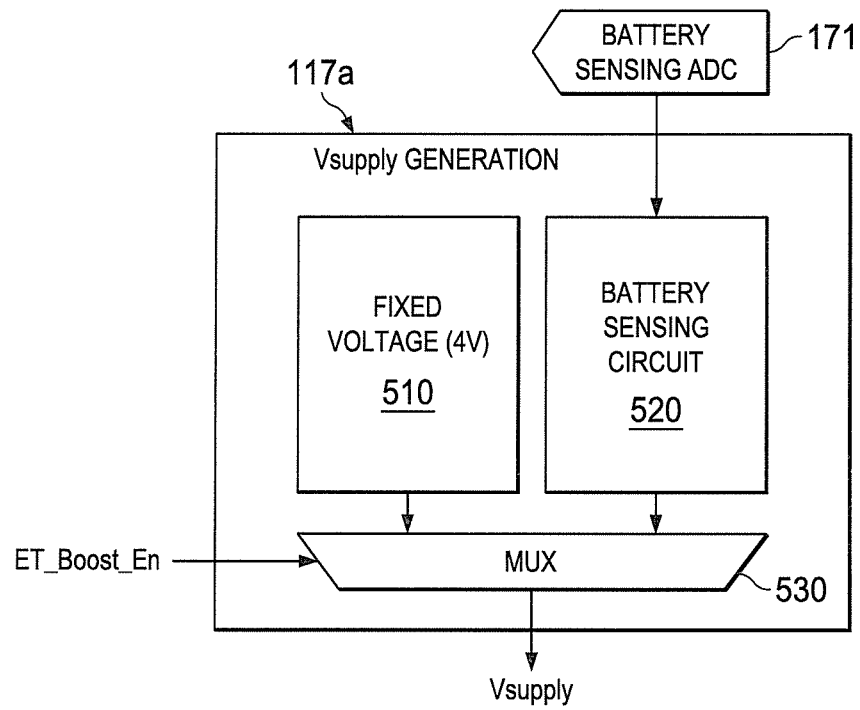
FIGS. 5 and 6 illustrate embodiments the PWM generator and the Vsupply voltage generation used to generate PWM signal(s)

One way to accommodate for the slowness of the circuits 170,171 is to set the boosted voltage supply to a fixed value (4V in this example) and select either (1) the Vbat sensed voltage from the battery sensing ADC 171 (for better battery voltage tracking) or (2) a fixed voltage signal set equal to the boosted voltage supply. FIG. 5 illustrates one possible implementation to accomplish this functionality.

As shown in FIG. 5, the Vsupply generator 117a receives a digital value representative of the continuously sensed battery voltage (from the ADC 171) and some signal processing (battery sensing circuit 520) may be required to clean up and up-sample the continuously monitored battery voltage information prior to the sensed signal being input to the PWM generator 116. A digital value representative of a fixed voltage is stored in a circuit 510, which may be a register or other storage-type circuit. In one embodiment, the fixed value is equal to (or approximately) the value of the boosted voltage supply output from the boost circuit 144. A multiplexer 530 selects and outputs either the fixed voltage value (e.g., the value of the boosted voltage supply) or the Vbat value as the Vsupply information for use by the PWM generator 116 to generate the PWM signal(s).

As will be appreciated, using the ET boost enable signal to control the multiplexer 530 to select which voltage to use effectively emulates the behavior of the ET modulator's analog circuit. This means the switching of mux 530 matches the position of the switches 322, 324 in the ET and APT modulator.

In another embodiment (not shown), the voltage supply sensing ADC 171 could also be configured to increase its sampling rate when the EP boost signal is asserted (or when the desired PA supply voltage $V_{cc}$ is above a level that is slightly less than sensed Vbat). This would eliminate the need for the additional circuitry shown in FIG. 5.

Figure 6:
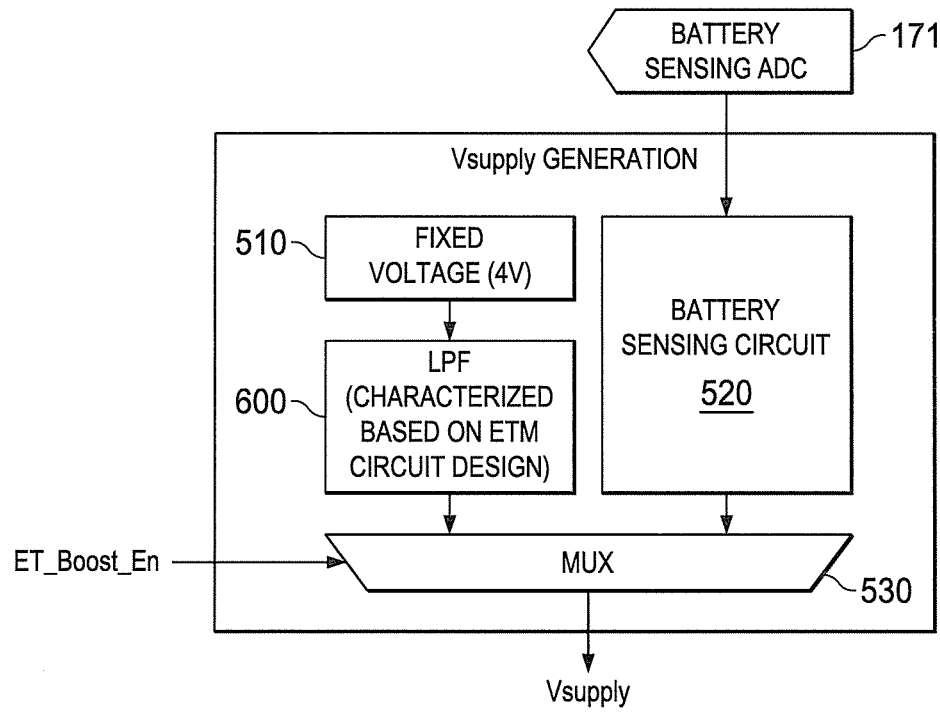

Now turning to FIG. 6, there is illustrated another embodiment of the Vsupply generation circuit 117a within the PWM generator 116. A low pass filter (LPF) 600 is added in line between the fixed voltage circuit 510 and the multiplexer 530 to emulate the settling process of the analog circuit (the analog circuit has limited BW which means there is always some settling time). The analog circuit here refers to the equivalent bandwidth limitation from the ET_Boost_En terminal/signal to the actual ET modulator supply voltage, e.g., the finite speed of the switches 322, 324, the parasitic printed circuit board (PCB) capacitance from digital baseband to the ET and APT modulator, the finite speed of the line control circuit 330, etc. The coefficients of the LPF 600 can be characterized in the lab to match the analog circuit design and, thus, improve system performance.

Figure 7:
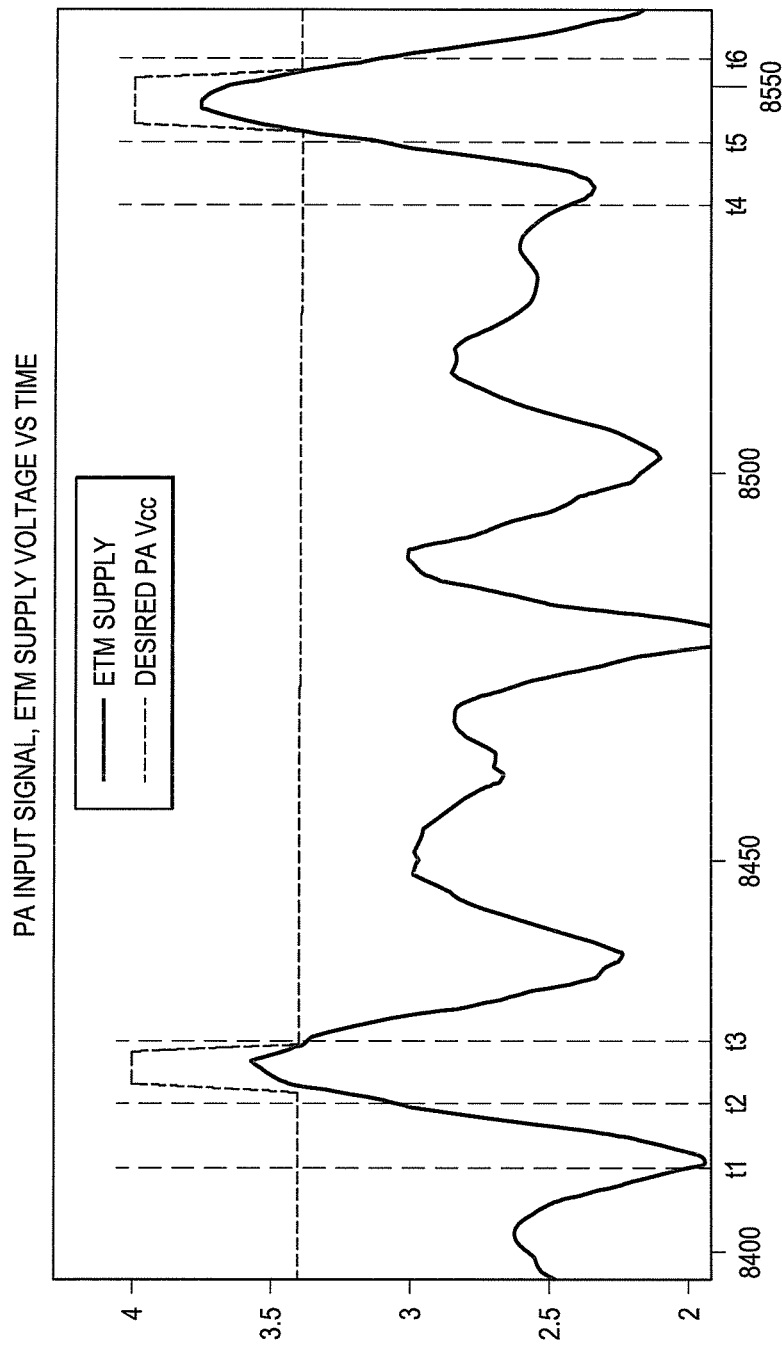
FIG. 7 is a graph illustrating a concept of pre-charging the boosted supply voltage in accordance with the present disclosure.

In another embodiment, pre-charging of the boosted voltage circuit can be implemented when a large signal peak is expected. This will reduce the boosted voltage stand-by time. FIG. 7 illustrates the concept of this method. The exact time (t2−t1 as shown in FIG. 7) at which to pre-charge the boost voltage capacitor depends on the analog circuit settling time, and can be variable in the digital design. This analog circuit settling time refers to the finite turn on speed of the boost converter inside the APT modulator 144. Shorter boosted voltage stand-by time can save power (less current).

As illustrated, at time t1, pre-charging of the output stage of the buck boost converter 144 starts. At time t2, the pre-charging is completed and power supply to the ET modulator 142 is switched (ET boost enable signal is asserted) from Vbat to the boosted voltage. At time t3, power supply to the ET modulator 142 is switched (ET boost enable signal is deasserted) from the boosted voltage to Vbat. Times t4, t5 and t6 illustrate another cycle showing the start of pre-charging, switching the ET voltage supply to the boosted voltage (from Vbat), and switching back to Vbat, respectively.

Figure 8:
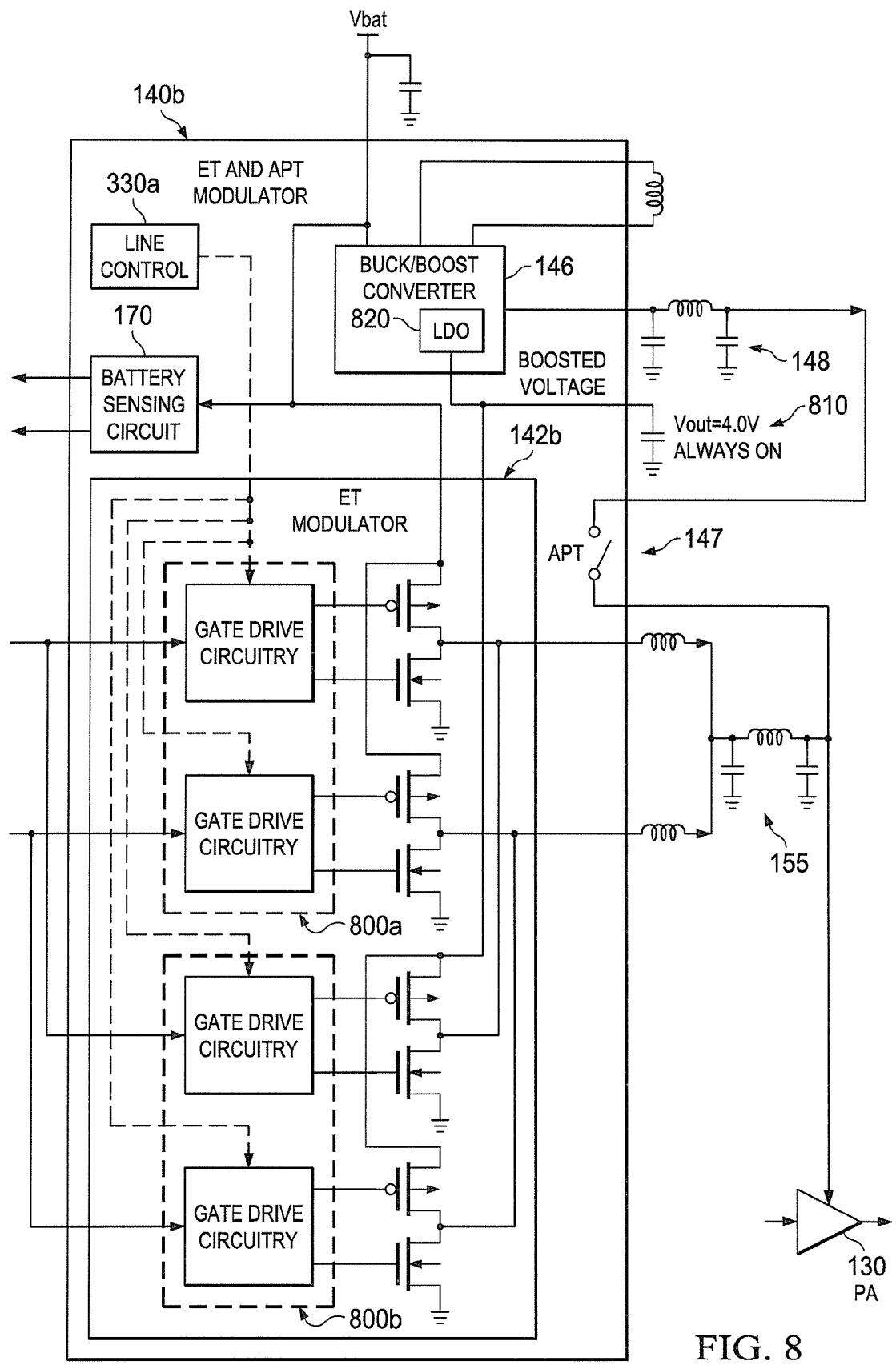
FIG. 8 illustrates different alternative embodiments of an ET and APT modulator in accordance with the present disclosure.

Now turning to FIG. 8, there is provided a detailed diagram illustrating other embodiments of the ET and APT modulator 140 (identified as 140*b*) in accordance with the present disclosure.

In one embodiment, the ET modulator 142 (identified as 142*b*) includes the first set of switching circuitry 143 (identified in FIG. 8 as 800*a*) and a second set of switching circuitry 800*b*. Instead of having only the first set—as shown in FIG. 3—the switching circuitry includes two sets of switches for the ET modulator switching core as illustrated in FIG. 8. As shown, the voltage power supply to the first switching circuitry 800*a* is provided by Vbat, while the voltage power supply to the second switching circuitry 800*b* is provided by the boosted voltage. A line control circuit 330*a* controls with set of switching circuitry 800*a*, 800*b* is active, based on the ET boost enable signal. When in boost mode, the switching circuitry 800*b* is active while switching circuitry 800*a* is inactive. When in normal mode, the switching circuitry 800*a* is active while switching circuitry 800*b* is inactive. With this implementation, the on-resistance (Ron) loss from the series switches 322, 324 (see FIG. 3) may be eliminated—which improves overall efficiency.

In another embodiment, instead of using the boost converter 146 output as the boosted voltage, a boost capacitor 810 is included which is charged with the boosted voltage that is already available within the boost converter 146 through a low dropout (LDO) voltage regulator 820. This embodiment may simplify the buck/boost converter 146 design and save power. The large boost capacitor 810 eliminates the need to have fast turn on time for the boost converter because the short burst of current needed for signal peaks can be provided by the capacitor itself.

As will be appreciated, the two embodiments described above with respect to FIG. 8 can be utilized together, or each may incorporated separately, in the main embodiment shown in FIG. 3.

Operation

Figure 12:
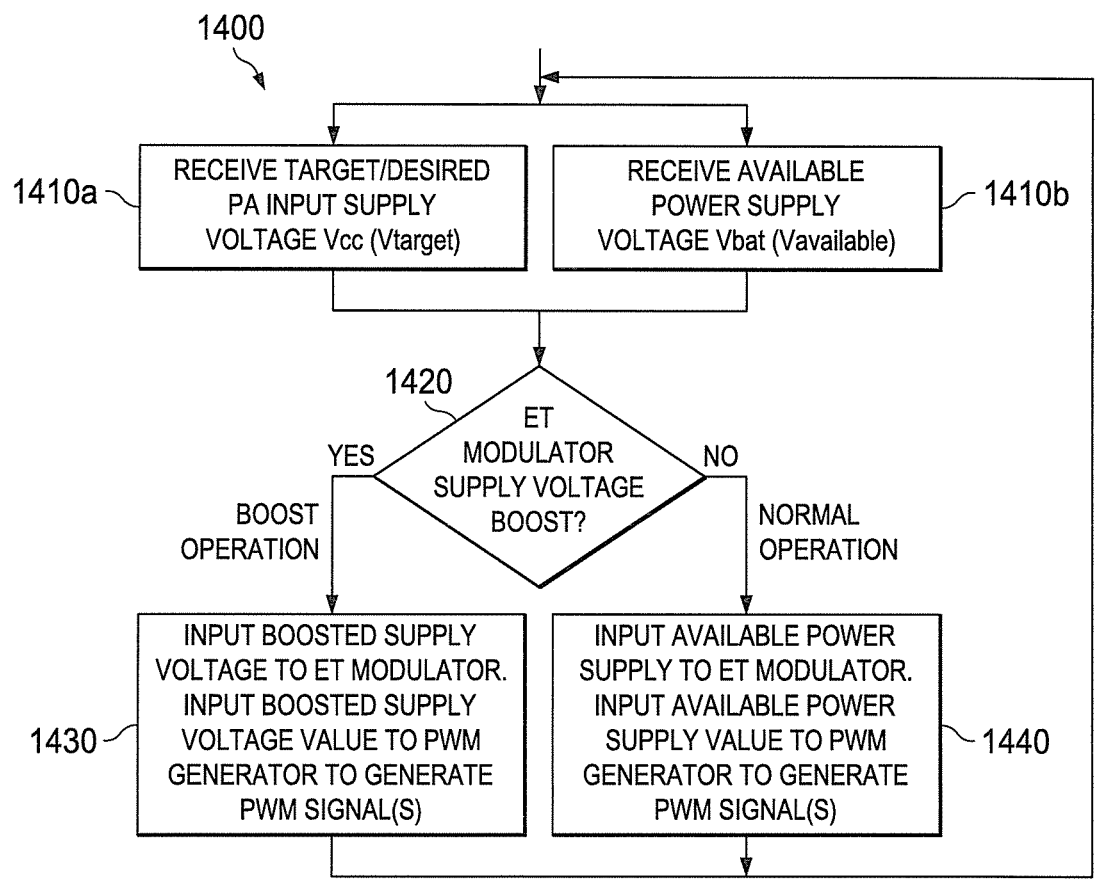
FIG. 12 illustrates a process 1400 for boosting the EP modulator voltage supply in the transmitter system of FIG. 3 in accordance with the present disclosure.

Now referring to FIG. 12, there is shown a process 1400 for boosting the EP modulator voltage supply in the transmitter system 300 in accordance with the present disclosure. As will be appreciated, only the relevant steps/functions necessary for an understanding of the present disclosure are described herein.

During operation, the ET boost mode controller 310 receives a signal indicative of the target or desired PA input supply voltage $V_{cc}$ (e.g., E signal), referred to as "Vtarget" (1410*a*). The controller 310 also receives a signal indicative of the available power supply voltage (e.g., Vbat), referred to as "Vavailable" (step 1410*b*).

Based on these two inputs, the controller 310 determines whether the voltage supply to the ET modulator 142 should be boosted or increased (step 1420). This determination is based on a comparison of Vtarget and Vavailable in relation to some predetermined threshold. In one embodiment, when Vtarget is equal to and greater than Vavailable, ET modulator boosting is activated. In another embodiment, when Vtarget>Vavailable*A, the ET modulator boosting operation is activated.

When activated, a boosted supply voltage is selectively input to provide supply power to the ET modulator 142 (step 1430). When unactivated (or deactivated), the available power supply is selectively input to provide supply power to the ET modulator 142 (step 1440). In other words, the power supply to the ET modulator 142 is selectively switched between the available power supply (e.g., normal operation) and the boosted supply voltage (e.g., boost operation). As will be appreciated, the magnitude of the boosted supply voltage will be greater than the magnitude of the available power supply. In one embodiment, the boosted supply voltage is generated from the available power supply voltage using a boost circuit (not shown in FIG. 12).

In addition, when activated, a boosted supply voltage signal is selectively input to the PWM generator 116 and used for generating the PWM signal(s) input to the ET modulator 142. When unactivated (or deactivated), an available power supply signal is selectively input to the PWM generator 116 and used for generating the PWM signal(s) input to the ET modulator 142.

Thus, a first voltage supply is input and provides power to the ET modulator 142 in a first mode (normal operation) and a second voltage supply is input and provides power to the ET modulator 142 in a second mode (boost operation). The present disclosure inputs the second voltage supply (greater than the first voltage supply) to the ET modulator 142 when the target or desired PA input supply voltage $V_{CC}$ meets or exceeds a predetermined threshold.

During both normal operation and boost operation, the ET boost mode controller 310 receives the envelope tracking signal E (or the same signal with pre-distortion applied) as Vtarget which tracks the data input to the envelope generator 114. It is understood that the input data will be the data transmitted by the transmitter system 300.

As will be appreciated, the above description of the process 1400 is equally applicable to all of the embodiments described herein.

Various new circuits and methods are described herein, including selectively supplying one of two supply voltages (e.g., battery voltage, boosted voltage) to the ET modulator 142. The target or desired PA voltage input supply Vcc signal/value and the available battery voltage signal/value are constantly being compared within, in one embodiment, the digital baseband circuit 110. As will be appreciated, the signals described within the baseband circuit 110 are in digital form.

In one embodiment, the decision to switch between the two values signals/values is performed within the digital baseband circuit 110. Thus, no analog circuit(s) are needed for the comparison/decision which saves power as compared to an analog-type approach. Inside the PWM generator 116, two Vsupply generation paths are provided which enables fast switching to overcome the conventional slow battery sensing circuit.

RF Communications Network

Figure 9:
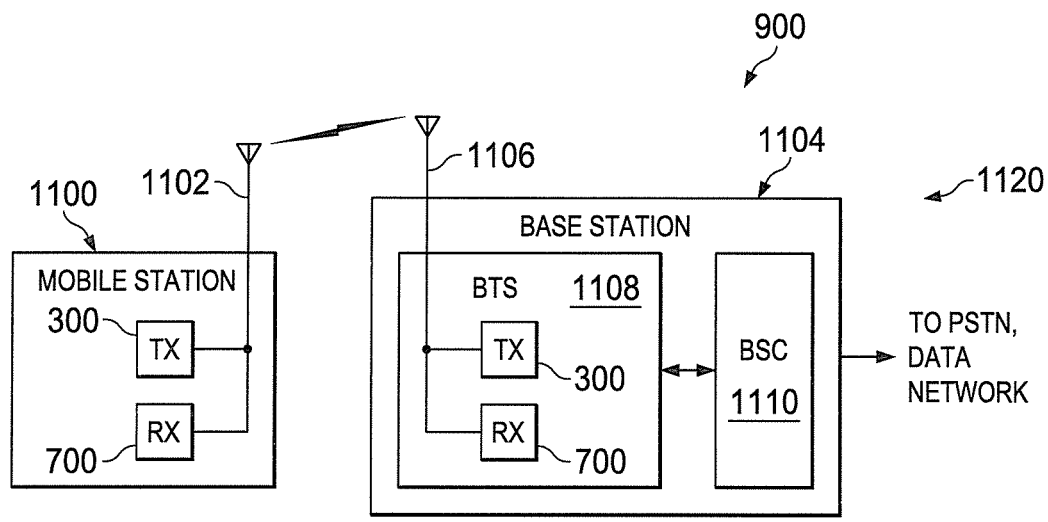
FIG. 9 illustrates an exemplary wireless communications network, including communication devices incorporating the transmitter system described in the present disclosure.

Now referring to FIG. 9, there is illustrated a block diagram of an exemplary wireless communications network 900 that utilizes the inventive envelope tracking system with dynamic ET modulator voltage supply boosting described herein. The wireless communications network 900 includes a first wireless communications device 1100 and a second wireless communications device 1104. The first wireless communications device 1100 is shown including the system 300 as described above and in accordance with the present invention. Similarly, the second wireless communications device 1104 may also include the system 300 as described above and in accordance with the present invention. It will be understood it is not necessary for both of the devices 1100 and 1104 to include the transmitter system 300—either one or both may include the system 300.

The two communications devices 1100 and 1104 communicate via RF signals utilizing an antenna 1102 and an antenna 1106, respectively, as shown.

The exemplary wireless communications network 900 may operate in accordance with one or more wireless protocols or technologies, such as CDMA, TDMA, FDMA, UMTS, LTE, etc. (and versions thereof). Further, the network 900 may support circuit-switched, and packet-switched or packet data communications.

In the embodiment in FIG. 9, the first communications device 1100 is illustrated as a mobile station or mobile terminal (or possibly fixed), such as a wireless handset, while the second communications device 1104 is illustrated as a base station, though not limited to such embodiment. The devices 1100, 1104 may be any device having wireless communications capabilities. As shown, the base station 1104 includes a base transceiver subsystem (BTS) 1108 that includes the system 300. The BTS 1108 is connected to a base station controller (BSC) 1110. Collectively, the BTS 1108 and the BSC 1110 are logically referred to as the "base station" 1104. Multiple BTS 1108 sometimes share one BSC 1110. The BSC 1110 manages resource allocation among the several BTSs. More generally, the terms "base station" and "access network" refer to any entity (or collection of entities) that communicates wirelessly with mobile stations for communications sessions (e.g., circuit-switched or packet-switched). The base station 1104 is coupled to the public switched telephone network (PSTN) or other data or switched network. This path may include additional elements such as a mobile switching center (MSC)(not shown) coupled to the BSC 1110.

Though the devices 1100 and 1120 are shown to include a receiver 700 separate from the transmitter system 300, it will be understood that the transmitter and receiver (or portions thereof) may be combined and form a "transceiver", or may be configured as one or multiple elements, and their characterization herein does not limit the devices 1100, 1120 or the transmitter 300 or receiver 700.

Figure 10:
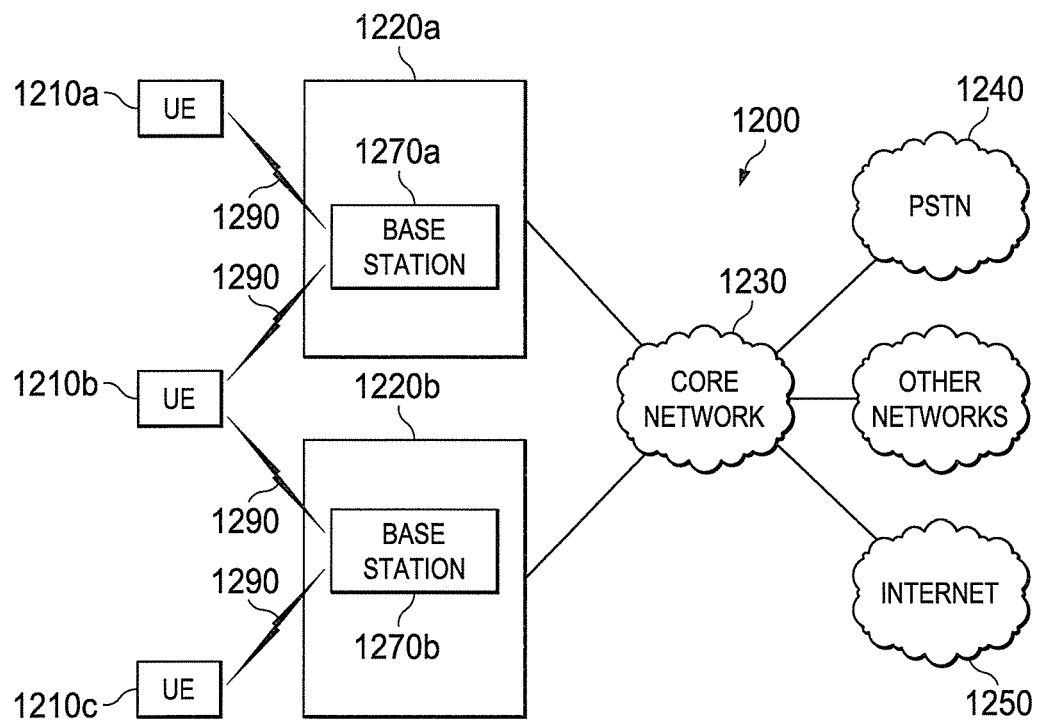
FIG. 10 is another embodiment of an exemplary wireless communications network, including communication devices incorporating the transmitter system described in the present disclosure.

The above identified methods/flows and devices may be incorporated into a wireless communications network and implemented in devices, such as that described below, and in the drawings below:

FIG. 10 illustrates another example communication system 1200 that utilizes the inventive envelope tracking system with dynamic ET modulator voltage supply boosting described herein. In general, the system 1200 enables multiple wireless users to transmit and receive data and other content. The system 1200 may implement one or more channel access methods, such as code division multiple access (CDMA), time division multiple access (TDMA), frequency division multiple access (FDMA), orthogonal FDMA (OFDMA), or single-carrier FDMA (SC-FDMA).

In this example, the communication system 1200 includes user equipment (UE) 1210*a*-1210*c*, radio access networks (RANs) 1220*a*-1220*b*, a core network 1230, a public switched telephone network (PSTN) 1240, the Internet 1250, and other networks 1260. While certain numbers of these components or elements are shown in FIG. 10, any number of these components or elements may be included in the system 1200.

The UEs 1210*a*-1210*c* are configured to operate and/or communicate in the system 1200. For example, the UEs 1210*a*-1210*c* are configured to transmit and/or receive wireless signals. Each UE 1210*a*-1210*c* represents any suitable end user device and may include such devices (or may be referred to) as a user equipment/device (UE), wireless transmit/receive unit (WTRU), mobile station, fixed or mobile subscriber unit, pager, cellular telephone, personal digital assistant (PDA), smartphone, laptop, computer, touchpad, wireless sensor, or consumer electronics device. As will be appreciated, one or more of the UEs 1210*a*-1210*c* may include the transmitter system 300 in accordance with this disclosure.

The RANs 1220*a*-1220*b* here include base stations 1270*a*-1270*b*, respectively. Each base station 1270*a*-1270*b* is configured to wirelessly interface with one or more of the UEs 1210*a*-1210*c* to enable access to the core network 1230, the PSTN 1240, the Internet 1250, and/or the other networks 1260. For example, the base stations 1270*a*-1270*b* may include (or be) one or more of several well-known devices, such as a base transceiver station (BTS), a Node-B (NodeB), an evolved NodeB (eNodeB), a Home NodeB, a Home eNodeB, a site controller, an access point (AP), or a wireless router. As will be appreciated, one or more of the base stations 1270*a*-1270*b* may include the transmitter system 300 in accordance with this disclosure.

In the embodiment shown in FIG. 10, the base station 1270*a* forms part of the RAN 1220*a*, which may include other base stations, elements, and/or devices. Also, the base station 1270*b* forms part of the RAN 1220*b*, which may include other base stations, elements, and/or devices. Each base station 1270*a*-1270*b* operates to transmit and/or receive wireless signals within a particular geographic region or area, sometimes referred to as a "cell." In some embodiments, multiple-input multiple-output (MIMO) technology may be employed having multiple transceivers for each cell.

The base stations 1270*a*-1270*b* communicate with one or more of the UEs 1210*a*-1210*c* over one or more air interfaces 1290 using wireless communication links. The air interfaces 1290 may utilize any suitable radio access technology.

It is contemplated that the system 1200 may use multiple channel access functionality, including such schemes as described above. In particular embodiments, the base stations and UEs implement LTE, LTE-A, and/or LTE-B. Of course, other multiple access schemes and wireless protocols may be utilized.

The RANs 1220*a*-1220*b* are in communication with the core network 1230 to provide the UEs 1210*a*-1210*c* with voice, data, application, Voice over Internet Protocol (VoIP), or other services. Understandably, the RANs 1220*a*-1220*b* and/or the core network 1230 may be in direct or indirect communication with one or more other RANs (not shown). The core network 1230 may also serve as a gateway access for other networks (such as PSTN 1240, Internet 1250, and other networks 1260). In addition, some or all of the UEs 1210*a*-1210*c* may include functionality for communicating with different wireless networks over different wireless links using different wireless technologies and/or protocols.

Although FIG. 10 illustrates one example of a communication system, various changes may be made to FIG. 10. For example, the communication system 1200 could include any number of UEs, base stations, networks, or other components in any suitable configuration.

Figure 11A:
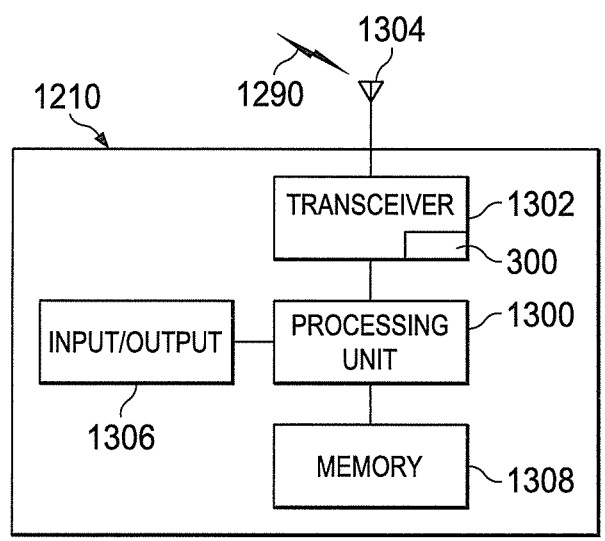
FIGS. 11A and 11B illustrate block diagrams of example devices that may implement the transmitter system and methods according to this disclosure.
Figure 11B:
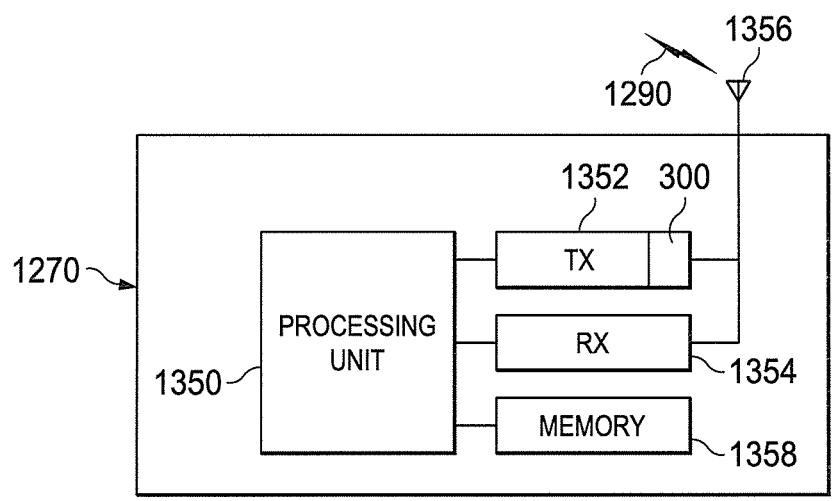

FIGS. 11A and 11B illustrate example devices that may implement the methods and teachings according to this disclosure. In particular, FIG. 11A illustrates an example UE 1210, and FIG. 11B illustrates an example base station 1270. These components could be used in the system 1200 or in any other suitable system.

As shown in FIG. 11A, the UE 1210 includes at least one processing unit 1300. The processing unit 1300 implements various processing operations of the UE 1210. For example, the processing unit 1300 could perform signal coding, data processing, power control, input/output processing, or any other functionality enabling the UE 1210 to operate in the system 1200. The processing unit 1300 also supports the methods and teachings described in more detail above. Each processing unit 1300 includes any suitable processing or computing device configured to perform one or more operations. Each processing unit 1300 could, for example, include a microprocessor, microcontroller, digital signal processor, field programmable gate array, or application specific integrated circuit.

The UE 1210 also includes at least one transceiver 1302, which includes the transmitter system 300. The transceiver 1302 is configured to modulate data or other content for transmission by at least one antenna 1304. The transceiver 1302 is also configured to demodulate data or other content received by the at least one antenna 1304. Each transceiver 1302 includes any suitable structure for generating signals for wireless transmission and/or processing signals received wirelessly. Each antenna 1304 includes any suitable structure for transmitting and/or receiving wireless signals. One or multiple transceivers 1302 could be used in the UE 1210, and one or multiple antennas 1304 could be used in the UE 1210. Although shown as a single functional unit, a transceiver 1302 could also be implemented using at least one transmitter and at least one separate receiver.

The UE 1210 further includes one or more input/output devices 1306. The input/output devices 1306 facilitate interaction with a user. Each input/output device 1306 includes any suitable structure for providing information to or receiving information from a user, such as a speaker, microphone, keypad, keyboard, display, or touch screen.

In addition, the UE 1210 includes at least one memory 1308. The memory 1308 stores instructions and data used, generated, or collected by the UE 1210. For example, the memory 1308 could store software or firmware instructions executed by the processing unit(s) 1300 and data used to reduce or eliminate interference in incoming signals. Each memory 1308 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 11B, the base station 1270 includes at least one processing unit 1350, at least one transmitter 1352, at least one receiver 1354, one or more antennas 1356, and at least one memory 1358. The processing unit 1350 implements various processing operations of the base station 1270, such as signal coding, data processing, power control, input/output processing, or any other functionality. The processing unit 1350 can also support the methods and teachings described in more detail above. Each processing unit 1350 includes any suitable processing or computing device configured to perform one or more operations. Each processing unit 1350 could, for example, include a microprocessor, microcontroller, digital signal processor, field programmable gate array, or application specific integrated circuit.

Each transmitter 1352 includes any suitable structure for generating signals for wireless transmission to one or more UEs or other devices, and further includes the transmitter system 300 described above. Each receiver 1354 includes any suitable structure for processing signals received wirelessly from one or more UEs or other devices. Although shown as separate components, at least one transmitter 1352 and at least one receiver 1354 (or components thereof) could be combined into a transceiver. Each antenna 1356 includes any suitable structure for transmitting and/or receiving wireless signals. While a common antenna 1356 is shown here as being coupled to both the transmitter 1352 and the receiver 1354, one or more antennas 256 could be coupled to the transmitter(s) 1352, and one or more separate antennas 1356 could be coupled to the receiver(s) 1354. Each memory 1358 includes any suitable volatile and/or non-volatile storage and retrieval device(s).

Additional details regarding UEs 1210 and base stations 1270 are known to those of skill in the art. As such, these details are omitted here for clarity.

In some embodiments, some or all of the functions or processes of the one or more of the devices are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A transmitter comprising:
   an envelope generator configured to receive a data signal to be transmitted and generate an envelope signal based on the received data signal;
   a pulse width modulation (PWM) generator coupled to the envelope generator and configured to output a PWM signal, the PWM generator comprising a sense circuit and a multiplexer; and
   an envelope tracking (ET) modulator coupled to the PWM generator and configured to receive the PWM signal and output a power amplifier (PA) switching supply source, wherein the ET modulator is further configured to receive a one of a first supply voltage or a second supply voltage in response to an ET modulator boost enable signal, wherein the second supply voltage is greater than the first supply voltage;

wherein:
the sense circuit is configured to:
sense the first supply voltage, and
generate a sense signal representative of the first supply voltage; and
the multiplexer is configured to:
receive the sense signal,
receive a boost signal representative of the second supply voltage, and
selectively output the sense signal or the boost signal in response to the ET modulator boost enable signal.

2. The transmitter in accordance with claim 1, further comprising:
an ET boost mode controller configured to generate the ET modulator boost enable signal when a magnitude of the envelope signal is greater than a predetermined value.

3. The transmitter in accordance with claim 1, further comprising:
a switching circuit coupled to the first supply voltage, the second supply voltage, and the ET modulator for switching and outputting the first supply voltage or the second supply voltage to the ET modulator.

4. The transmitter in accordance with claim 3, wherein the switching circuit comprises:
a first switch coupled to the first supply voltage;
a second switch coupled to the second supply voltage; and
wherein the first switch and the second switch selectively output the first supply voltage or the second supply voltage to the ET modulator in response to the ET modulator boost enable signal.

5. The transmitter in accordance with claim 1, further comprising:
a boost circuit configured to receive the first supply voltage and generate the second supply voltage therefrom.

6. The transmitter in accordance with claim 1, wherein the sense circuit comprises an analog-to-digital converter (ADC) for generating the sense signal in digital format.

7. The transmitter in accordance with claim 1, further comprising:
an ET boost mode controller configured to generate the ET modulator boost enable signal when a magnitude of the envelope signal is greater than a predetermined value.

8. A transmitter comprising:
a power terminal configured to deliver an available supply voltage from an available power source for use by the transmitter;
a boost circuit coupled to the power terminal and configured to generate a boosted supply voltage greater than the available supply voltage;
an envelope generator configured to receive a data signal to be transmitted by the transmitter and generate an envelope signal;
a pulse width modulation (PWM) generator configured to receive the envelope signal and output a PWM signal;
an envelope tracking (ET) modulator coupled to the PWM generator and configured to modulate an ET modulator input supply voltage;

a controller configured to receive the envelope signal and a signal indicative of the available power supply voltage and generate a dynamic boost enable/disable signal in response thereto; and
a switching circuit coupled to the available supply voltage and the boosted supply voltage and configured to select and input either the available supply voltage or the boosted supply voltage as the ET modulator input supply voltage.

9. The transmitter in accordance with claim 8, wherein the switching circuit comprises:
a first switch coupled to the available supply voltage;
a second switch coupled to the boosted supply voltage; and
wherein the first switch and the second switch selectively output the available supply voltage or the boosted supply voltage to the ET modulator in response to the dynamic boost enable/disable signal.

10. The transmitter in accordance with claim 9, further comprising:
a sense circuit configured to sense and generate a sense signal representative of the available supply voltage; and
a multiplexer configured to receive the sense signal and a boost signal representative of the boosted supply voltage and selectively output the sense signal or the boost signal to the PWM generator in response to the dynamic boost enable/disable signal.

11. The transmitter in accordance with claim 10, wherein the sense circuit comprises an analog-to-digital converter (ADC) for generating the sense signal in digital format.

12. A method of dynamically boosting a supply input voltage to a power amplifier (PA) comprising:
receiving, at a transmitter, a data signal to be transmitted;
generating, by the transmitter, an envelope signal based on the received data signal;
generating a pulse width modulation (PWM) signal, based on the envelope signal;
receiving the pulse width modulation (PWM) signal;
based on an envelope tracking (ET) modulator boost enable signal, receiving one of a first supply voltage or a second supply voltage, the second supply voltage being greater than the first supply voltage;
generating a sense signal representative of the first supply voltage; and
receiving the sense signal and a boost signal representative of the second supply voltage and selectively outputting the sense signal or the boost signal in response to the ET modulator boost enable signal; and
outputting, by the transmitter, a power amplifier (PA) switching supply source.

13. The method of claim 12, further comprising:
generating the ET modulator boost enable signal when a magnitude of the envelope signal is greater than a predetermined value.

14. The method of claim 12, further comprising:
generating the second supply voltage from the first supply voltage.

15. The method of claim 12, wherein the generating of the sense signal comprises using an analog-to-digital converter (ADC) to generate the sense signal in digital format.

16. The method of claim 12, further comprising:
generating the ET modulator boost enable signal when a magnitude of the envelope signal is greater than a predetermined value.

17. The method of claim 12, wherein the receiving one of the first supply voltage or the second supply voltage comprises receiving from a multiplexer.

18. The method of claim 12, wherein the receiving one of the first supply voltage or the second supply voltage comprises receiving from a switch.

\* \* \* \* \*